(12) United States Patent
Cheng

(10) Patent No.: US 11,526,718 B2
(45) Date of Patent: Dec. 13, 2022

(54) METHOD OF MANUFACTURING MINI SMART CARD

(71) Applicant: BEAUTIFUL CARD CORPORATION, Taoyuan (TW)

(72) Inventor: Meng-Jen Cheng, Taoyuan (TW)

(73) Assignee: BEAUTIFUL CARD CORPORATION, Taoyuan (TW)

( * ) Notice: Subject to any disclaimer, the term of this patent is extended or adjusted under 35 U.S.C. 154(b) by 35 days.

(21) Appl. No.: 17/369,011

(22) Filed: Jul. 7, 2021

(65) Prior Publication Data

US 2021/0334616 A1     Oct. 28, 2021

Related U.S. Application Data

(62) Division of application No. 16/596,803, filed on Oct. 9, 2019, now Pat. No. 11,106,961.

(51) Int. Cl.
*H05K 1/11*     (2006.01)
*H05K 3/28*     (2006.01)
(Continued)

(52) U.S. Cl.
CPC ....... *G06K 19/07722* (2013.01); *H05K 1/185* (2013.01); *H05K 3/28* (2013.01);
(Continued)

(58) Field of Classification Search
CPC .......... H05K 1/11; H05K 1/141; H05K 1/183; H05K 1/185; H05K 3/28; H05K 3/30; H05K 3/36; H05K 3/103; H05K 3/281; H05K 3/284; H05K 3/4611; H05K 2201/0053; H05K 2201/10128; H05K 2203/065; G06K 19/02; G06K 19/06; G06K 19/08; G06K 19/067; G06K 19/077; G06K 19/07722; B32B 27/283; B32B 27/302; B32B 27/322; B32B 37/00; B32B 37/12
(Continued)

(56) References Cited

U.S. PATENT DOCUMENTS 4,626,669 A     12/1986    Davis et al.
4,747,620 A     5/1988     Kay et al.
(Continued)

OTHER PUBLICATIONS

Restriction Requirement dated Mar. 4, 2021 for U.S. Appl. No. 16/596,803.
(Continued)

*Primary Examiner* — Xiaoliang Chen
(74) *Attorney, Agent, or Firm* — Schmeiser, Olsen & Watts, LLP

(57) ABSTRACT

A mini smart card and a method of manufacturing the mini smart card are introduced. The method includes disposing bilayered print layers on a top side and a bottom side of a circuit layer, respectively; performing a heat-compression treatment and then a printing treatment on the circuit layer and the bilayered print layers; removing surface layers from the bilayered print layers; and disposing transparent protective layers on the bilayered print layers, respectively. The bilayered print layers are prevented from deforming under the heat generated during the printing treatment. Removal of the surface layers from the bilayered print layers effectively reduces the thickness of the mini smart card.

3 Claims, 3 Drawing Sheets

(51) Int. Cl.

| | | |
|---|---|---|
| *H05K 3/30* | (2006.01) | |
| *H05K 3/36* | (2006.01) | |
| *G06K 19/02* | (2006.01) | |
| *G06K 19/06* | (2006.01) | |
| *G06K 19/08* | (2006.01) | |
| *G06K 19/067* | (2006.01) | |
| *G06K 19/077* | (2006.01) | |
| *B32B 37/00* | (2006.01) | |
| *B32B 37/12* | (2006.01) | |
| *H05K 3/46* | (2006.01) | |
| *H05K 1/18* | (2006.01) | |

(52) U.S. Cl.
CPC . *H05K 3/4611* (2013.01); *H05K 2201/10053* (2013.01); *H05K 2201/10128* (2013.01); *H05K 2203/065* (2013.01)

(58) Field of Classification Search
USPC .............. 361/764, 737, 748, 760, 771, 807; 29/825, 831, 832, 827
See application file for complete search history.

(56) References Cited

U.S. PATENT DOCUMENTS

| | | | |
|---|---|---|---|
| 4,760,575 A | | 7/1988 | Watanabe |
| 4,788,102 A | | 11/1988 | Koning et al. |
| 4,829,169 A | | 5/1989 | Watanabe |
| 4,941,686 A | | 7/1990 | Johnson |
| 6,036,099 A | | 3/2000 | Leighton |
| 6,207,004 B1 | * | 3/2001 | Murasawa ........... G06K 19/077 156/303.1 |
| 6,288,905 B1 | | 9/2001 | Chung |
| 6,644,552 B1 | | 11/2003 | Herslow |
| 6,659,355 B1 | | 12/2003 | Fischer et al. |
| 6,752,432 B1 | | 6/2004 | Richardson |
| 8,322,623 B1 | | 12/2012 | Mullen et al. |
| 9,390,363 B1 | | 7/2016 | Herslow et al. |
| 9,390,366 B1 | | 7/2016 | Herslow et al. |
| 2002/0130186 A1 | | 9/2002 | Lasch et al. |
| 2002/0145049 A1 | | 10/2002 | Lasch et al. |
| 2002/0168513 A1 | | 11/2002 | Hattori et al. |
| 2003/0038174 A1 | | 2/2003 | Jones |
| 2003/0047615 A1 | | 3/2003 | Batoha |
| 2003/0065938 A1 | * | 4/2003 | Kitamura .................. G07F 7/08 726/19 |
| 2003/0141373 A1 | | 7/2003 | Lasch et al. |
| 2003/0178495 A1 | | 9/2003 | Jones et al. |
| 2003/0226901 A1 | * | 12/2003 | Kim ................. G06K 19/07769 235/492 |
| 2004/0159709 A1 | | 8/2004 | Ohta et al. |
| 2004/0234816 A1 | | 11/2004 | Azakami et al. |
| 2005/0130840 A1 | | 6/2005 | Tatewaki et al. |
| 2005/0170961 A1 | | 8/2005 | Kuboyama et al. |
| 2005/0247795 A1 | | 11/2005 | Riedl et al. |
| 2006/0011731 A1 | | 1/2006 | Anders et al. |
| 2006/0292946 A1 | | 12/2006 | Kiekhaefer |
| 2007/0008595 A1 | | 1/2007 | Watanabe et al. |
| 2007/0235548 A1 | | 10/2007 | Singleton |
| 2007/0237932 A1 | | 10/2007 | Shvartsman |
| 2008/0149731 A1 | | 6/2008 | Arai et al. |
| 2008/0245865 A1 | | 10/2008 | Mosteller |
| 2008/0251581 A1 | | 10/2008 | Faenza |
| 2008/0296887 A1 | | 12/2008 | Baggenstos |
| 2009/0169776 A1 | | 7/2009 | Herslow |
| 2010/0008055 A1 | * | 1/2010 | Droz .................... G06K 19/077 361/761 |
| 2010/0021740 A1 | | 1/2010 | Tanaka et al. |
| 2010/0025475 A1 | | 2/2010 | Webb et al. |
| 2010/0316841 A1 | | 12/2010 | Geuens |
| 2011/0024511 A1 | | 2/2011 | Rietzler et al. |
| 2011/0031319 A1 | | 2/2011 | Kiekhaefer et al. |
| 2013/0255078 A1 | * | 10/2013 | Cox .......................... B32B 3/18 29/830 |
| 2013/0255848 A1 | * | 10/2013 | Cox .................. G06K 19/07724 156/60 |
| 2014/0224881 A1 | | 8/2014 | Herslow |
| 2015/0041546 A1 | | 2/2015 | Herslow et al. |
| 2015/0180229 A1 | | 6/2015 | Herslow |
| 2015/0223580 A1 | | 8/2015 | Kinney et al. |
| 2015/0246504 A1 | | 9/2015 | Liu et al. |
| 2016/0110639 A1 | | 4/2016 | Finn et al. |
| 2016/0203399 A1 | * | 7/2016 | Cox .................. G06K 19/07745 156/275.5 |
| 2016/0224879 A1 | | 8/2016 | Amarnath et al. |
| 2016/0260005 A1 | * | 9/2016 | Karafotis ........... G06K 19/0776 |
| 2016/0369323 A1 | * | 12/2016 | Revilla ................. B01L 3/5027 |
| 2017/0017871 A1 | | 1/2017 | Finn et al. |
| 2017/0077589 A1 | | 3/2017 | Finn et al. |
| 2017/0098151 A1 | | 4/2017 | Herslow et al. |
| 2017/0243104 A1 | * | 8/2017 | Cox .................. G06K 19/07728 |
| 2017/0262749 A1 | * | 9/2017 | Cox .................... B32B 37/1018 |
| 2017/0316300 A1 | | 11/2017 | Herslow et al. |
| 2018/0018551 A1 | | 1/2018 | Carrier et al. |
| 2018/0043726 A1 | | 2/2018 | Roche |
| 2018/0211147 A1 | | 7/2018 | Cox |
| 2018/0232616 A1 | | 8/2018 | Szumski et al. |
| 2018/0291243 A1 | | 10/2018 | Yang |
| 2018/0326777 A1 | | 11/2018 | Reddy |
| 2018/0339503 A1 | | 11/2018 | Finn et al. |
| 2019/0033206 A1 | * | 1/2019 | Spoettl .................... G06K 19/07 |
| 2019/0073578 A1 | | 3/2019 | Lowe et al. |
| 2019/0204812 A1 | | 7/2019 | Cox |
| 2019/0255874 A1 | | 8/2019 | Takeda et al. |
| 2020/0189244 A1 | | 6/2020 | Brennan et al. |
| 2020/0198390 A1 | | 6/2020 | Senge |
| 2020/0238747 A1 | * | 7/2020 | Cox .................... B42D 25/455 |
| 2021/0056371 A1 | | 2/2021 | Mosteller |

OTHER PUBLICATIONS

Notice of Allowance dated May 13, 2021 for U.S. Appl. No. 16/596,803.

\* cited by examiner

METHOD OF MANUFACTURING MINI SMART CARD

CROSS-REFERENCE TO RELATED APPLICATION

This application is a divisional patent application of U.S. application Ser. No. 16/596,803 filed on Oct. 9, 2019, the entire contents of which are hereby incorporated by reference for which priority is claimed under 35 U.S.C. § 120.

BACKGROUND OF THE INVENTION

1. Field of the Invention

The present disclosure relates to cards and methods of manufacturing the cards, and in particular to a mini smart card and a method of manufacturing the same.

2. Description of the Related Art

Commercially-available smart cards, such as IC-embedded debit cards and IC-embedded credit cards, are for use with ATMs and card readers to enable their users to withdraw money, transfer money, and pay by credit cards. Despite the wide variety of smart cards and card readers, smart cards nowadays are never thicker than 0.84 mm, otherwise they cannot be inserted into ATMs or card readers.

A process of manufacturing conventional smart cards involves disposing a print layer on the top side and bottom side of a circuit layer, conveying the circuit layer and the print layers to a printer for printing so as to print patterns or words on the print layers, and disposing a transparent protective layer on the print layers so as to finalize the manufacturing of the smart cards. However, if the circuit layer is too thick, the print layers will have to be compressed in order to thin them. The thinned print layers, however, are deformed and curved when heated up on their way to the printer, and in consequence the smart cards thus manufactured fail. To prevent the print layers from being deformed and curved, it is necessary to increase the thickness of the print layers to more than 0.84 mm. As a result, the prior art is currently stuck in a dilemma of preventing the print layers from being deformed and curved or manufacturing smart cards too thick to be inserted into ATMs or card readers.

BRIEF SUMMARY OF THE INVENTION

An objective of the present disclosure is to provide a mini smart card and a method of manufacturing the same. The mini smart card comprises bilayered print layers suitable for undergoing high-temperature treatment during a printing treatment process. Furthermore, removal of surface layers from the bilayered print layers makes for the reduction in the total thickness of the smart card and thereby attains miniaturization thereof.

To achieve at least the above objective, the present disclosure provides a method of manufacturing a mini smart card, comprising the steps of: providing a circuit layer; disposing a bilayered print layer on a top side and a bottom side of the circuit layer; performing a heat-compression treatment and then a printing treatment on the circuit layer, the bilayered print layers; removing a surface layer from each said bilayered print layer; and disposing a transparent protective layer on each said bilayered print layer.

Given the aforesaid method, owing to the heat-compression treatment performed on the bilayered print layers disposed on the circuit layer, the bilayered print layers are flatly disposed on the circuit layer before undergoing the printing treatment. Furthermore, after undergoing the heat-compression treatment, the bilayered print layers can withstand the heat generated during the printing treatment and thus do not deform and curve. Furthermore, completion of the printing treatment, followed by removal of surface layers from the bilayered print layers, and then followed by disposing transparent protective layers on the bilayered print layers, is conducive to further reduction in the total thickness of the mini smart card, to not only circumvent the problem with temperature-related deformation during the manufacturing process, but also attain miniaturization of the smart card.

To achieve at least the above objective, the present disclosure further provides the mini smart card which comprises: a circuit layer with a top side and a bottom side, wherein the circuit layer is 0.5 mm thick; two bilayered print layers disposed on the top side and the bottom side of the circuit layer, respectively, with the bilayered print layers being each 0.1 mm thick; and two transparent protective layers disposed on the bilayered print layers, respectively, with the transparent protective layers being each 0.07 mm thick; wherein the transparent protective layers are disposed on the bilayered print layers, respectively, after the surface layers have been removed from the bilayered print layers.

Given the aforesaid structure, upon removal of the surface layers from the bilayered print layers, the bilayered print layers can withstand the heat generated during a printing treatment process and thus do not deform and curve. Furthermore, completion of the printing treatment, followed by removal of surface layers from the bilayered print layers, and then followed by disposing transparent protective layers on the bilayered print layers, is conducive to further reduction in the total thickness of the mini smart card, to not only circumvent the problem with temperature-related deformation during the manufacturing process, but also attain miniaturization of the smart card.

DETAILED DESCRIPTION OF THE INVENTION

Figure 1:
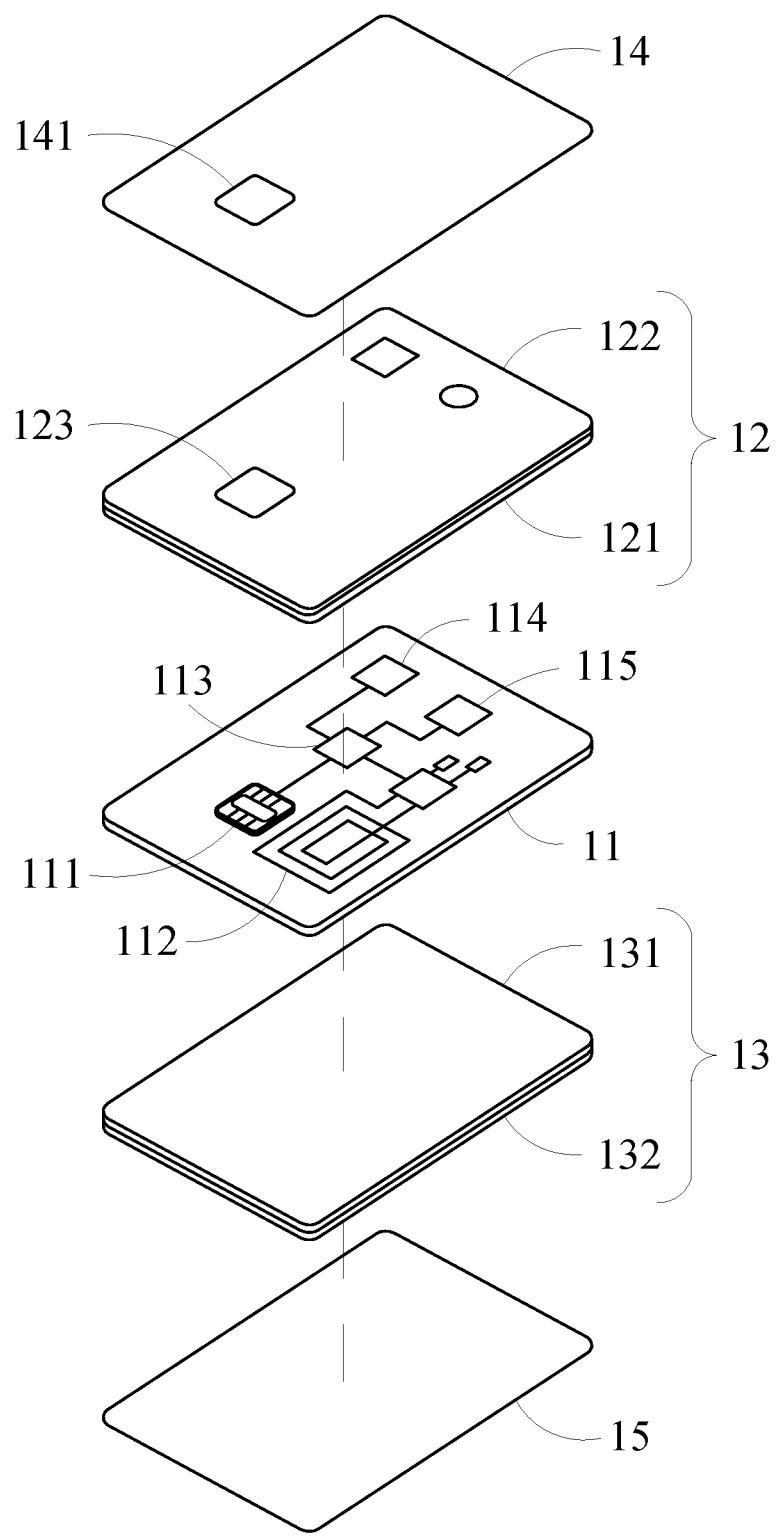
FIG. 1 is an exploded view according to the first preferred embodiment of the present disclosure.

Referring to FIG. 1, a mini smart card according to the first preferred embodiment of the present disclosure comprises a circuit layer 11, two bilayered print layers 12, 13, and two transparent protective layers 14, 15.

The circuit layer 11 has a top side and a bottom side. The circuit layer 11 is 0.5 mm thick. In this embodiment, an integrated circuit (IC) chip 111, a power supply unit 112, a microprocessor 113, a display unit 114 and a switch unit 115 are disposed on the top side of the circuit layer 11. The microprocessor 113 is electrically connected to the IC chip 111, the power supply unit 112, the display unit 114 and the switch unit 115. The microprocessor 113 processes data. The power supply unit 112 provides a power source. The power supply unit 112 comprises a battery, a capacitor or an induction antenna which generates electrical current by induction. The IC chip 111 stores therein a user data. The display unit 114 displays related data, such as transaction data, user data, etc. The switch unit 115 starts and shuts down functions of the mini smart card of the present disclosure.

In this embodiment, the bilayered print layers 12, 13 are disposed on the top side and the bottom side of the circuit layer 11, respectively. The bilayered print layers 12, 13 are each 0.1 mm thick. The bilayered print layers 12, 13 comprise print blank layers 121, 131 directly disposed on the top side and the bottom side of the circuit layer 11, respectively, and surface layers 122, 132 disposed on the print blank layers 121, 131, respectively. The surface layers 122, 132 are each a removable print thickening layer. The print blank layers 121, 131 and the surface layers 122, 132 are together 0.1 mm thick. The print blank layers 121, 131 are each 0.05 mm thick. The surface layers 122, 132 are each 0.05 mm thick. Upon removal of the surface layers 122, 132, the print blank layers 121, 131 solely account for the total thickness of the bilayered print layers 12, 13, i.e., 0.05 mm.

In this embodiment, three holes 123 are disposed on the bilayered print layer 12 on the top side of the circuit layer 11 such that the IC chip 111, the display unit 114 and the switch unit 115 are exposed from the holes 123.

In this embodiment, after the bilayered print layers 12, 13 have been disposed on the circuit layer 11, the bilayered print layers 12, 13 and the circuit layer 11 undergo a heat-compression treatment such that the bilayered print layers 12, 13 adhere to the circuit layer 11 slightly, and then the bilayered print layers 12, 13 and the circuit layer 11 undergo a printing treatment to perform the printing of the print blank layers 121, 131 of the bilayered print layers 12, 13. After that, the surface layers 122, 132 are removed from the bilayered print layers 12, 13 to expose the print blank layers 121, 131.

In this embodiment, the transparent protective layers 14, 15 are disposed on the bilayered print layers 12, 13, respectively. The transparent protective layers 14, 15 are each 0.07 mm thick. The transparent protective layers 14, 15 are disposed on the print blank layers 121, 131, respectively, to protect the print blank layers 121, 131.

In this embodiment, a hole 141 is formed on the transparent protective layer 14 disposed on the top side of the circuit layer 11 to expose the IC chip 111.

Figure 2:
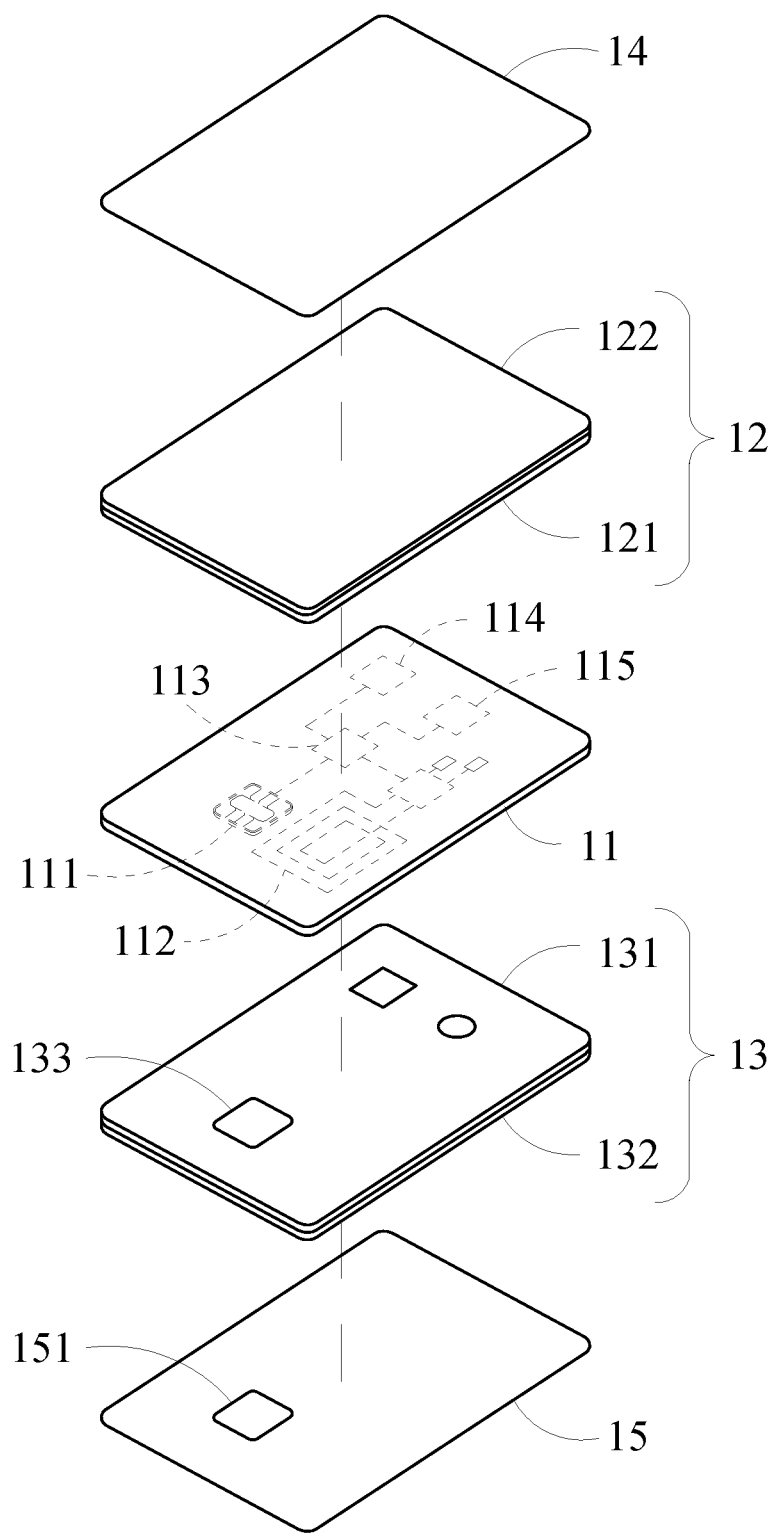
FIG. 2 is an exploded view according to the second preferred embodiment of the present disclosure.

Referring to FIG. 2, the present disclose provides a mini smart card in the second preferred embodiment. The second preferred embodiment is identical to the first preferred embodiment except for the following: the IC chip 111, the power supply unit 112, the microprocessor 113, the display unit 114 and the switch unit 115 are disposed on the back side of the circuit layer 11; three holes 133 are formed on the bilayered print layer 13 disposed on the bottom side of the circuit layer 11; and a hole 151 is formed on the transparent protective layer 15 disposed on the bottom side of the circuit layer 11.

Figure 3:
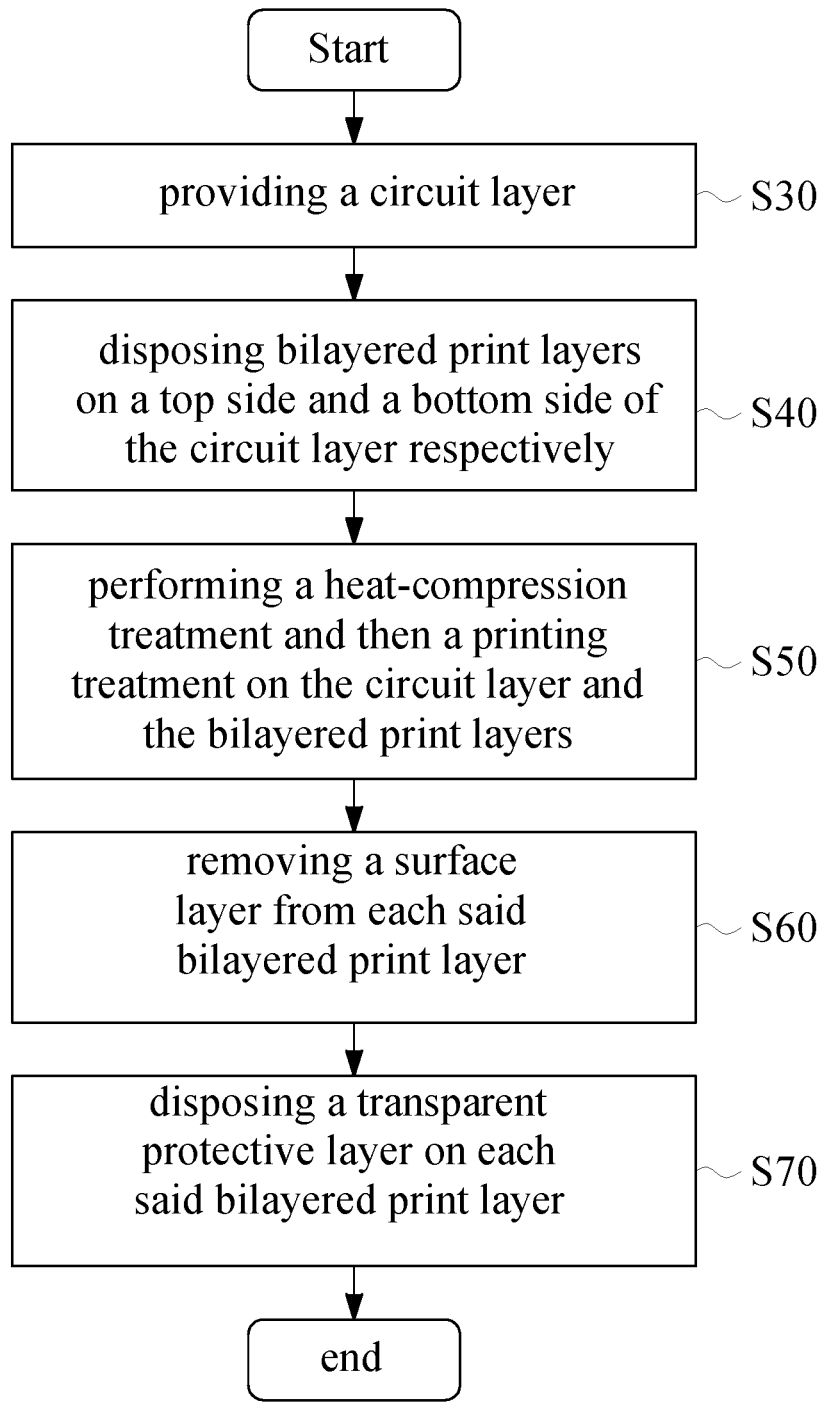
FIG. 3 is a schematic view of the process flow of a manufacturing method according to the second preferred embodiment of the present disclosure.

The above description of the mini smart card is conducive to an understanding of a method of manufacturing the mini smart card, as provided by the present invention. Referring to FIG. 3, the method comprises the steps as follows: providing a circuit layer 11 (S30); disposing bilayered print layers 12, 13 on a top side and a bottom side of the circuit layer 11, respectively (S40); performing a heat-compression treatment and then a printing treatment on the circuit layer 11 and the bilayered print layers 12, 13 (S50); removing surface layers 122, 132 from the bilayered print layers 12, 13, respectively (S60); disposing transparent protective layers 14, 15 on the bilayered print layers 12, 13, respectively (S70).

The bilayered print layers 12, 13 comprise the print blank layers 121, 131 directly disposed on the top side and bottom side of the circuit layer 11, respectively, and the surface layers 122, 132 disposed on the print blank layers 121, 131, respectively. Upon completion of the step S60 of removing surface layers 122, 132 from the bilayered print layers 12, 13, respectively, the surface layers 122, 132 are removed, leaving behind the print blank layers 121, 131.

Upon completion of the step S70 of disposing transparent protective layers 14, 15 on the bilayered print layers 12, 13, respectively, the transparent protective layers 14, 15 are disposed on the print blank layers 121, 131, respectively.

In this embodiment, the sum of the thickness of the circuit layer 11 (0.5 mm), the thickness of the bilayered print layers 12, 13 (0.1 mm each), and the thickness of the transparent protective layers 14, 15 (0.05 mm each) meets the requirement of maximum thickness of 0.84 mm. After the bilayered print layers 12, 13 have been disposed on the top side and the bottom side of the circuit layer 11, they undergo the heat-compression treatment and then the printing treatment. Owing to the surface layers 122, 132 of the bilayered print layers 12, 13, the bilayered print layers 12, 13 undergoing the printing treatment withstand the heat and thus do not deform/curve. Upon completion of the printing treatment, the surface layers 122, 132 are removed, and in consequence the thickness of the mini smart card of the present disclosure equals the sum of the thickness of the circuit layer 11 (0.5 mm), the thickness of the print blank layers 121, 131 (0.05 mm each), and the thickness of the transparent protective layers 14, 15 (0.07 mm each), i.e., 0.74 mm. Therefore, the mini smart card of the present disclosure not only circumvents the problem with temperature-related deformation during a manufacturing process, but also meets the requirement of maximum thickness of 0.84 mm.

Furthermore, even if the thickness of the circuit layer 11 varies because of an overly complicated circuit, the removal of the surface layers 122, 132 from the bilayered print layers 12, 13 can effectively reduce the thickness of the mini smart card of the present disclosure, thereby enhancing the stability and ease of the manufacturing process.

While the present disclosure has been described by means of specific embodiments, numerous modifications and variations could be made thereto by those skilled in the art without departing from the scope and spirit of the present disclosure set forth in the claims.

What is claimed is:

1. A method of manufacturing a mini smart card, comprising the steps of:
   providing a circuit layer;
   disposing a bilayered print layer on a top side and a bottom side of the circuit layer;
   performing a heat-compression treatment and then a printing treatment on the circuit layer, the bilayered print layers;
   removing a surface layer from each said bilayered print layer; and
   disposing a transparent protective layer on each said bilayered print layer.

2. The method of claim 1, wherein the bilayered print layers comprise two print blank layers directly disposed on the top side and the bottom side of the circuit layer, respectively, and the surface layer disposed on each said print blank layer, and the surface layers are removed upon completion of the step of removing the surface layers from the bilayered print layers.

3. The method of claim 2, wherein the transparent protective layer is disposed on each said print blank layer upon completion of the step of disposing the transparent protective layer on each said bilayered print layer.

\* \* \* \* \*